United States Patent
Choi

(10) Patent No.: US 10,164,148 B2
(45) Date of Patent: Dec. 25, 2018

(54) HIGH-VOLTAGE DRIVEN LIGHT EMITTING ELEMENT AND METHOD FOR MANUFACTURING SAME

(71) Applicant: CONSTANTEC CO., LTD., Gunpo-si (KR)

(72) Inventor: Woon Yong Choi, Dangjin-si (KR)

(73) Assignee: CONSTANTEC CO., LTD., Gunpo-si (KR)

( * ) Notice: Subject to any disclaimer, the term of this patent is extended or adjusted under 35 U.S.C. 154(b) by 0 days.

(21) Appl. No.: 15/540,127

(22) PCT Filed: Dec. 31, 2015

(86) PCT No.: PCT/KR2015/014574
§ 371 (c)(1),
(2) Date: Jun. 27, 2017

(87) PCT Pub. No.: WO2016/108667
PCT Pub. Date: Jul. 7, 2016

(65) Prior Publication Data
US 2017/0352780 A1     Dec. 7, 2017

(30) Foreign Application Priority Data

Dec. 31, 2014   (KR) .................. 10-2014-0194958

(51) Int. Cl.
*H01L 33/06* (2010.01)
*H01L 33/08* (2010.01)
(Continued)

(52) U.S. Cl.
CPC .......... *H01L 33/08* (2013.01); *H01L 33/0016* (2013.01); *H01L 33/0062* (2013.01);
(Continued)

(58) Field of Classification Search
CPC ............ H01L 33/0016; H01L 33/0062; H01L 33/0066; H01L 33/06; H01L 33/08; H01L 33/145; H01L 33/30
See application file for complete search history.

(56) References Cited

U.S. PATENT DOCUMENTS

| | | | | |
|---|---|---|---|---|
| 5,276,698 A | * | 1/1994 | Yoshida | .................. B82Y 20/00 257/E33.008 |
| 8,471,243 B1 | * | 6/2013 | Arena | ............. H01L 31/035236 257/13 |

(Continued)

FOREIGN PATENT DOCUMENTS

| | | |
|---|---|---|
| JP | 2012190881 | 10/2012 |
| KR | 20060124149 | 12/2006 |

(Continued)

OTHER PUBLICATIONS

International Search Report—PCT/KR2015/014574 dated Apr. 27, 2016.

*Primary Examiner* — Allan R Wilson
(74) *Attorney, Agent, or Firm* — Novick, Kim & Lee, PLLC; Jae Youn Kim

(57) ABSTRACT

Provided is a semiconductor layer light-emitting element having tunneling blocking layers interposed between adjacent active regions, wherein the tunneling blocking layers are semiconductor layers, which do not allow the movement of an electron or a hole at an applied voltage sufficient to activate only one active region among all active regions, and independently separate two adjacent active regions in a quantum region range, so that the semiconductor light-emitting element comprises multiple independent active regions in a vertical direction in a single chip and thus can be driven at high voltages.

19 Claims, 7 Drawing Sheets

(51) Int. Cl.
*H01L 33/00* (2010.01)
*H01L 33/14* (2010.01)
*H01L 33/30* (2010.01)
*H01L 33/04* (2010.01)

(52) U.S. Cl.
CPC .............. *H01L 33/04* (2013.01); *H01L 33/06* (2013.01); *H01L 33/145* (2013.01); *H01L 33/30* (2013.01); *H01L 33/0066* (2013.01)

(56) References Cited

U.S. PATENT DOCUMENTS

| | | | |
|---|---|---|---|
| 2003/0170927 A1* | 9/2003 | Holonyak, Jr. | ........ B82Y 10/00 438/47 |
| 2005/0067627 A1 | 3/2005 | Shen et al. | |
| 2005/0253151 A1 | 11/2005 | Sakai et al. | |
| 2008/0116471 A1* | 5/2008 | Watanabe | ............... H01L 33/10 257/98 |
| 2008/0251799 A1 | 10/2008 | Ikezawa | |
| 2009/0212278 A1 | 8/2009 | Jorgenson et al. | |
| 2016/0099773 A1* | 4/2016 | Raj | ..................... H04B 10/116 398/118 |
| 2016/0111594 A1* | 4/2016 | Nagel | ..................... H01L 33/04 257/13 |

FOREIGN PATENT DOCUMENTS

| | | |
|---|---|---|
| KR | 20090002214 | 1/2009 |
| KR | 20130022056 | 3/2013 |

\* cited by examiner

HIGH-VOLTAGE DRIVEN LIGHT EMITTING ELEMENT AND METHOD FOR MANUFACTURING SAME

TECHNICAL FIELD

The present invention relates to a semiconductor light emitting element and, more particularly, to a high-voltage driven light emitting element configured to drive a plurality of active areas vertically formed inside a single chip.

BACKGROUND ART

A semiconductor light emitting element is a semiconductor element using a principle of generating light as electrons supplied through an n-type semiconductor layer and holes supplied through a p-type semiconductor layer are recombined with each other in an active layer.

An emission wavelength of the semiconductor light emitting element is determined based on an energy band gap of a used semiconductor material. A GaN-based material is used to emit light having blue light, green light, or ultraviolet light, and a GaAs-based (or AlGaInP-based) material is selected to emit red light or infrared light.

In recent years, the semiconductor light emitting element is applied as a light or a high luminance light source. To achieve this, in a state in which a multiple active area including a plurality of active areas is formed, high-voltage electric power is applied to the semiconductor light emitting element to drive the semiconductor light emitting element.

In particular, in a 3-in-1 package in which three primary colors of red/green/blue are packaged in one chip together, because a voltage that is higher than a required driving voltage is applied to a red LED chip having a relatively low driving voltage as compared with a green LED chip and a blue LED chip, overall driving efficiency of the semiconductor light emitting element deteriorates.

PRIOR ART DOCUMENT (Patent Document)
U.S. Patent Application Publication No. US2008/0251799A
U.S. Patent Application Publication No. US2005/0067627A
U.S. Patent Application Publication No. US2005/0253151A

DISCLOSURE

Technical Problem

The present invention provides a GaAs-based (or AlGaInP-based) light emitting element which has a relatively low driving voltage as compared with a GaN-based material and in which a plurality of active areas are vertically formed so that the GaAs-based (AlGaInP-based) light emitting element may be driven at a high voltage.

The present invention also provides a light emitting element having improved driving efficiency and reliability using the high-voltage driven light emitting element.

The present invention also provides a full-color display in which a driving circuit configured to drive the high-voltage driven light emitting element is simplified.

The present invention also provides a method suitable for manufacturing the light emitting element, a module including the light emitting element, and the full-color display employing the same.

Technical Solution

In order to solve the above-mentioned problems, there is provided a high-voltage driven semiconductor light emitting element according to an embodiment of the present invention. One active area is spaced apart from another active area by a tunneling length or more, and an entire driving voltage formed by summing a driving voltage configured to drive the one active area and a driving voltage configured to drive another active area are applied to the high-voltage driven semiconductor light emitting element.

To this end, there is provided a semiconductor light emitting element including a lower semiconductor layer formed on a substrate, a first active area configured to emit light as electrons and holes are coupled to each other on the lower semiconductor layer, a first anti-tunneling layer formed on the first active area, a second active area formed on the first anti-tunneling layer, an upper semiconductor layer formed on the second active area, and a lower electrode and an upper electrode formed on an exposed portion of the lower semiconductor layer or a partial area of a conductive substrate connected to the lower semiconductor layer and on the upper semiconductor layer, wherein the plurality of first anti-tunneling layers and the plurality of second active areas may be included, and the first anti-tunneling layer, which is a semiconductor layer in which electrons or holes are not moved under an applied voltage that is sufficient for activating only one of all of the active areas and which is a thicker semiconductor layer than the general quantum barrier layer, independently separates the first active area and the second active area from each other in a quantum domain.

To achieve one aspect of the present invention, there is provided a method for manufacturing a high-voltage driven semiconductor light emitting element according to an embodiment of the present invention, the method including forming a lower semiconductor layer on a substrate, forming a first active area configured to emit light as electrons and holes are coupled to each other on the lower semiconductor layer, forming a first anti-tunneling layer on the first active area, forming a second active area on the first anti-tunneling layer, forming an upper semiconductor layer on the second active area, and when the lower semiconductor layer is coupled to an insulative substrate, exposing a portion of the lower semiconductor layer and forming a lower electrode and an upper electrode on the exposed area and the upper semiconductor layer, or when the lower semiconductor layer is coupled to a conductive substrate, forming a lower electrode and an upper electrode on a lower portion of the conductive substrate and the upper semiconductor layer, wherein forming a first anti-tunneling layer and forming a second active area may be repeatedly performed, and the first anti-tunneling layer, which is a semiconductor layer in which electrons or holes are not moved under an applied voltage that is sufficient for activating only one of all of the active areas and which is a thicker semiconductor layer than the general quantum barrier layer, independently separates the first active area and the second active area from each other in a quantum domain.

Advantageous Effects

A high-voltage driven semiconductor light emitting element according to the present invention may provide more active areas to a driving voltage applied to the semiconductor light emitting element, thereby reducing a surplus voltage generated in the light emitting element.

Because of this, heat generation in the light emitting element may be reduced, so that driving efficiency may be increased and reliability of the element may be improved.

Further, a free space within a package cavity may be provided during packaging, so that packaging efficiency may be improved.

In addition, in a full-color display employing the high-voltage driven semiconductor light emitting element according to the present invention, the driving voltage is applied to more active areas, the surplus voltage is reduced, an amount of heat generation in a system is reduced, and thus, an amount of introduced external dust generated during air cooling is remarkably reduced, so that reliability of the system may be improved.

Further, more active areas are provided to the driving voltage and the surplus voltage is reduced, so that the number of required SMPSs employed in the system may be reduced.

Further, electric wiring in a module according to high-voltage driving is simplified, so that the number of PCBs used for configuring a circuit may be reduced.

DESCRIPTION OF THE INVENTION

BEST MODE

Figure 1:
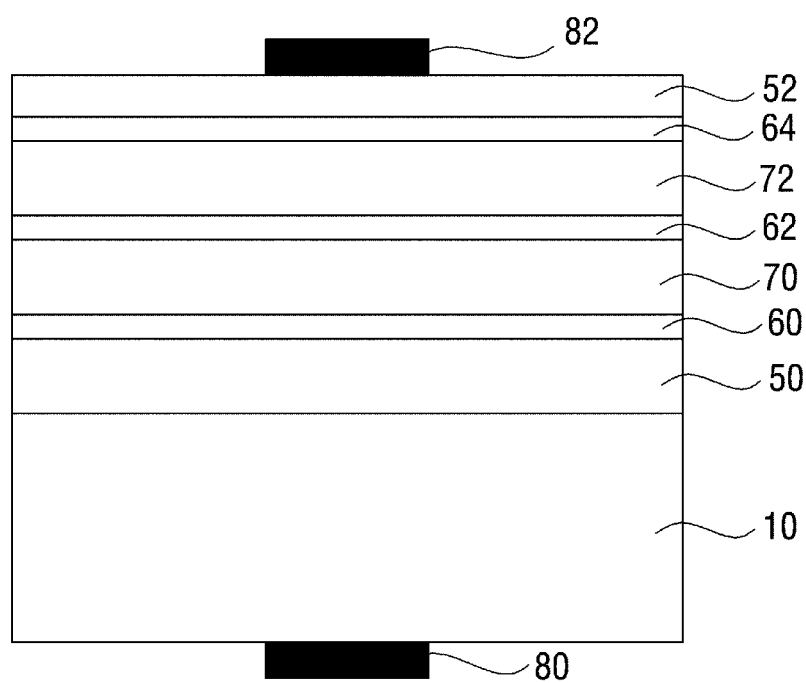
FIG. 1 is a schematic view illustrating a representative high-voltage driven semiconductor light emitting element according to an embodiment of the present invention.

Advantages and features of the present invention, and methods for achieving the same will be made clear with reference to embodiments, which will be described below in detail, together with the accompanying drawings. However, the present invention is not limited to the embodiments described below, but will be implemented in different various forms. The present embodiment merely makes the disclosure of the present invention complete, and is provided to completely notify those skilled in the art to which the present invention pertains of the scope of the present invention, and the present invention is merely defined by the scope of the claims. Throughout the specification, the same components are designated by the same reference numerals.

Figure 3:
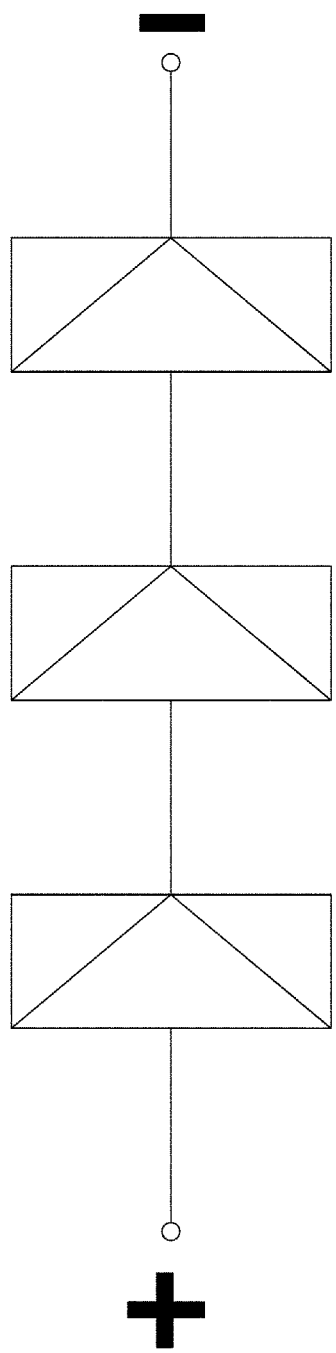

First, in description of a semiconductor light emitting element having a plurality of active areas according to the related art as compared with a high-voltage driven semiconductor light emitting element according to the present invention, FIG. 3 illustrates the semiconductor light emitting element having a plurality of active areas according to the related art.

A monolithic light emitting element, which is designed such that a plurality of active areas largely include a first active area, a second active area, and a third active area, and light emitted by the active areas corresponds to any one of a red color R, a green color G, and a blue color B, so that the light emitting element may emit white light without using a fluorescent substance, has been reported as the light emitting element having a plurality of active areas according to the related art.

Figure 4:
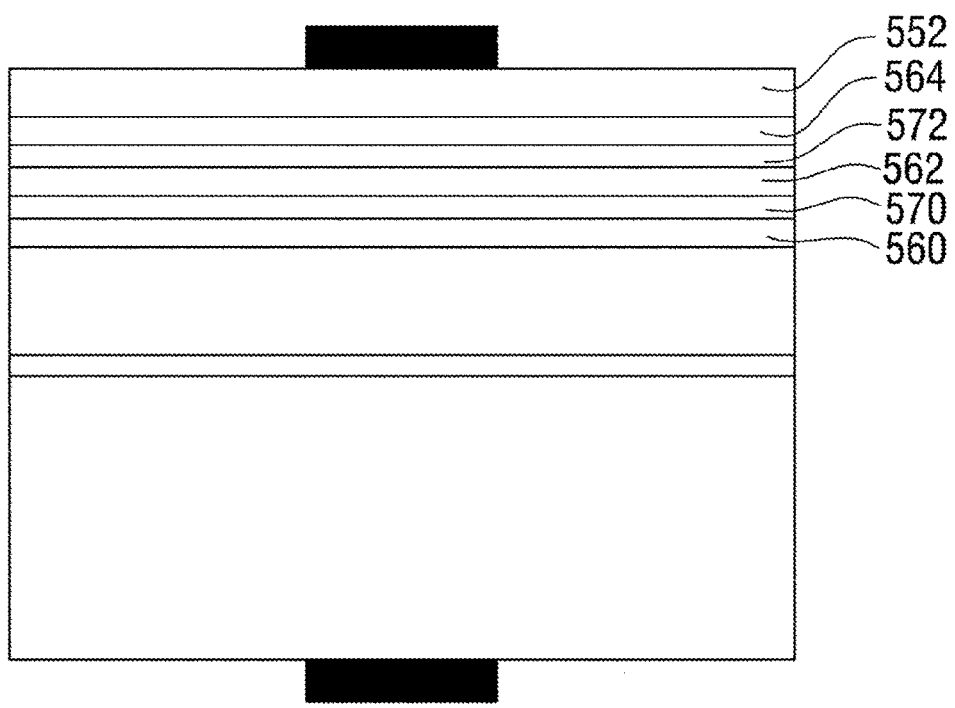
FIG. 4 illustrates a semiconductor light emitting element having a plurality of active areas according to the related art.

Here, emission of red light R and emission of green light G and blue light B may be implemented using a GaAs-based (or AlGaInP-based) material and a GaN-based (or ZnO-based) material, respectively. In the general semiconductor growth such as MOCVD and MBE, it is very difficult to continuously grow a plurality of active areas formed of heterogeneous materials without interruption of growth. For this reason, as illustrated in FIG. 4, coupling layers 570 and 572 configured to bond the active areas to each other in the outside of a growth chamber exist between active areas 560, 562, and 564. In this case, the active areas correspond to independent active areas from the viewpoint of a quantum domain, and a high voltage is required as a driving voltage to drive the active areas. However, as mentioned above, in this configuration, the active areas formed of heterogeneous materials are bonded to each other in the outside of the growth chamber, and white light is implemented by combining different wavelengths of the heterogeneous materials.

Further, in another embodiment of the related art, the fact that a plurality of active areas formed of the same homogeneous material are in-situ formed (processing without extracting an epilayer to the outside of the growth chamber) has been reported. However, in the plurality of in-site-grown active areas, the thicknesses of the coupling layers 570 and 572 between the active areas 560, 562, and 564 are formed to be smaller than the general quantum barrier or a diffusion length of a carrier, and the plurality of active areas are substantially similar to one multiple quantum well structure. To drive the light emitting element, an applied voltage corresponding to driving of one active area and compensation for a voltage drop for resistance of the added epilayer are included. Accordingly, the light emitting element may be driven using a low voltage even without applying a high voltage.

Figure 5:
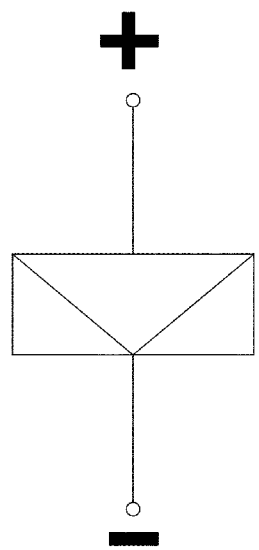
FIGS. 5 and 6 are electric circuit diagrams corresponding to the semiconductor light emitting element having a plurality of active areas according to the related part.
Figure 6:
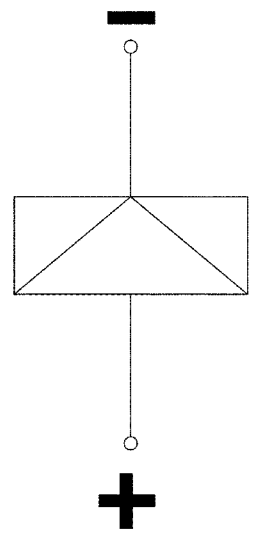

FIGS. 5 and 6 are electric circuit diagrams of the semi-conductor light emitting element having a plurality of active areas according to the related art. It is noted herein that the semiconductor light emitting element is illustrated as one diode even though it has the plurality of active areas.

FIGS. 5 and 6 are electric circuit diagrams corresponding to the fact that an upper semiconductor 552 of the light emitting element having the plurality of active areas according to the related art is doped with a p-type dopant or an n-type dopant (resistance of the added epilayer according to the formation of the plurality of active areas is omitted).

Hereinafter, a high-voltage driven semiconductor light emitting element and a method for manufacturing the same according to the present invention will be described with reference to the accompanying drawings.

Figure 2:
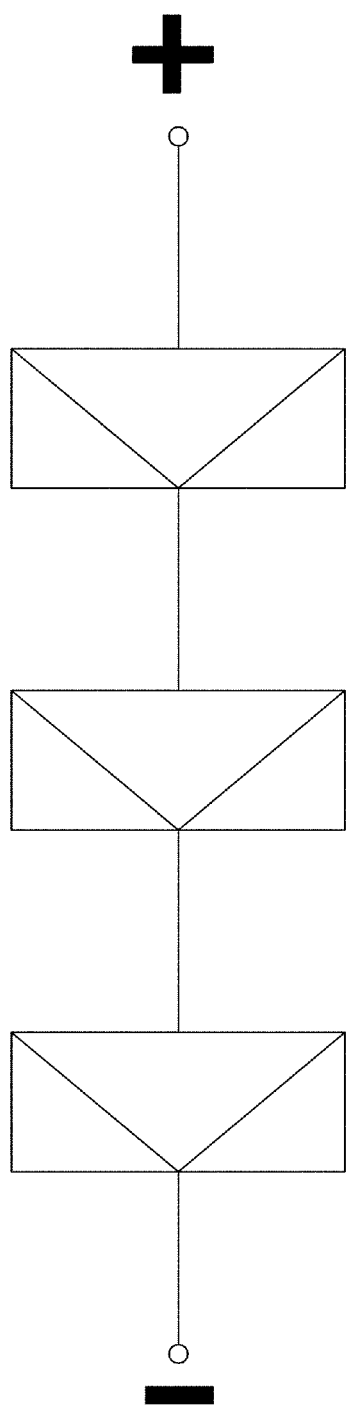
FIGS. 2 and 3 are electric circuit diagrams corresponding to the semiconductor element of FIG. 1.

FIG. 1 is a schematic view illustrating a high-voltage driven semiconductor light emitting element according to a representative embodiment of the present invention, and FIGS. 2 and 3 are electric circuit diagrams according to the semiconductor element of FIG. 1.

Referring to FIG. 1, a method for manufacturing the high-voltage driven semiconductor light emitting element according to the present invention includes: preparing a conductive substrate 10; growing a lower semiconductor layer 50 doped with a first conductivity type on the conductive substrate 10; growing a first active area 60 on the lower semiconductor layer 50; growing a first anti-tunneling layer 70 on the first active area 60; growing a second active area 62 on the first anti-tunneling layer 70; growing a second anti-tunneling layer 72 on the second active area 62; growing a third active area 64 on the second anti-tunneling layer 72; growing an upper semiconductor layer 52 on the third active area 64; and forming a lower electrode 80 and an upper electrode 82 on the conductive substrate 10 and the upper semiconductor layer 52, respectively.

In the method, a first doped GaAs, Si, and SiC may be selected as the conductive substrate, and GaAs among the conductive substrate is preferred in consideration of lattice matching with an epilayer of a red light emitting element according to the present invention. In a not-lattice-matched heterogenous growth, a buffer layer (not illustrated) may be formed on the conductive layer and the lower semiconductor layer 50 may be grown on the buffer layer.

Although a GaAs-based clad layer and AlGaInP-based clad layer, which are doped with opposite types, may be selected as the lower semiconductor layer 50 and the upper semiconductor layer 52, it is preferable that a first doped $(Al_xGa_{1-x})_{0.5}In_{0.5}P$ be selected as the lower semiconductor layer 50, and a second doped $(Al_xGa_{1-x})_{0.5}In_{0.5}P$ be selected as the upper semiconductor layer 52.

The first active area 60, the second active area 62, and the third active area 64 may have one of a double hetero (DH) structure, a single quantum well (SQW) structure, and a multiple quantum well (MQW) structure, and may be formed of an AlGaInP-based material. When the active areas have the double hetero structure, x, which is an Al composition of the first doped $(Al_xGa_{1-x})_{0.5}In_{0.5}P$ lower semiconductor layer 50 and the second doped $(Al_xGa_{1-x})_{0.5}In_{0.5}P$ upper semiconductor layer 50, has a range of $0.5 \leq x \leq 1.0$, and the first to third active areas 60, 62 and 64 is formed of $(Al_xGa_{1-x})_{0.5}In_{0.5}P$ having an Al composition of x in a range of $0 \leq x \leq 0.45$. Further, when the active areas have the quantum well structure, an $(Al_xGa_{1-x})_{0.5}In_{0.5}P$ quantum barrier layer having an Al composition of x in a range of $0.5 \leq x \leq 1.0$ and an $(Al_xGa_{1-x})_{0.5}In_{0.5}P$ quantum well layer having an Al composition of x in a range of $0 \leq x \leq 0.45$ may be formed.

The anti-tunneling layers formed between the active areas are adapted to independently separate two adjacent active areas from each other in a quantum area. The first anti-tunneling layer 70 and the second anti-tunneling layer 72 may be formed of $(Al_xGa_{1-x})_{0.5}In_{0.5}P$ having an Al composition of x in a range of $0 \leq x \leq 1.0$, and each anti-tunneling layer, which is a semiconductor layer in which electrons or holes cannot be moved under an applied voltage that is sufficient for activating only one of all of the active areas and is a thicker semiconductor layer than the general quantum barrier layer, has a thickness of 3 μm or more and serves to independently separate two adjacent active areas from each other in the quantum area. Further, the second anti-tunneling layer 72 and the first anti-tunneling layer 70 may be doped with a second type dopant and a first type dopant, respectively, when the upper semiconductor layer 52 is doped with the first type dopant, and may be doped with the first type dopant and the second type dopant, respectively, when the upper semiconductor layer 52 is doped with the second type dopant. Accordingly, a serial junction of a PNPN junction or an NPNP junction from a vertically upper side of the element is formed, and may be thus illustrated as the electric circuit diagram as in FIG. 2 or FIG. 3.

An applied voltage that is sufficient for activating the above-described active area, which is determined based on an energy band gap of semiconductors constituting the active areas, corresponds to about 3V in blue and green GaN-based light emitting elements and corresponds to about 2V in red and infrared ray GaAs-based (or AlGaInP-based) light emitting element.

As illustrated in FIGS. 2 and 3, when a circuit having three serial diodes is driven, an applied voltage corresponding to a sum of voltages required for driving the diodes is required. In the present embodiment, a driving voltage of the $(Al_xGa_{1-x})_{0.5}In_{0.5}P$ red light emitting diode is about 2V, and as illustrated in FIGS. 1, 2 and 3, in the light emitting element including three independent active areas, a driving voltage of 6V, which is 2V ×3, is required to drive the light emitting diodes.

The driving voltage 6V of the semiconductor red light emitting element according to an embodiment of the present invention, which is a voltage for driving the semiconductor light emitting element including three active areas that are independently serial to each other in a single chip, corresponds to a high voltage that is three times or more of 2V which is the driving voltage of the general red light emitting element.

Further, the high-voltage driven light emitting element according to the present invention may include two or more active areas and one or more anti-tunneling layers, as compared with the conventional light emitting element having one active area, and the active areas and the anti-tunneling layers may be properly selected to correspond to a selected applied voltage. For example, when the applied voltage is 12V, the high-voltage driven light emitting element may include six active areas.

Another embodiment of the present invention is illustrated in FIG. 5. In another embodiment illustrated in FIG. 7, the above-described conductive substrate 10 on which the epilayer of the high-voltage driven semiconductor light emitting element is grown is removed, and the epilayer of the high-voltage driven semiconductor light emitting element is bonded to a transfer substrate 12. The transfer substrate may be selected from a transparent substrate that may emit generated light to the outside of the element even through the transfer substrate and a metal substrate that may reflect generated light and has an improved heat generation function. The transparent transfer substrate may be formed of one selected from GaP, AlGaAS, AlGaInP, SiC, AN and GaN or a synthetic material thereof, and the metal substrate may be formed of a material including any one of Al, Ag, TiW, W, Mo, Ta, TaN and Cu. When the metal substrate is selected, a connection layer 30 may further include a reflective layer as well as a junction layer.

Figure 7:
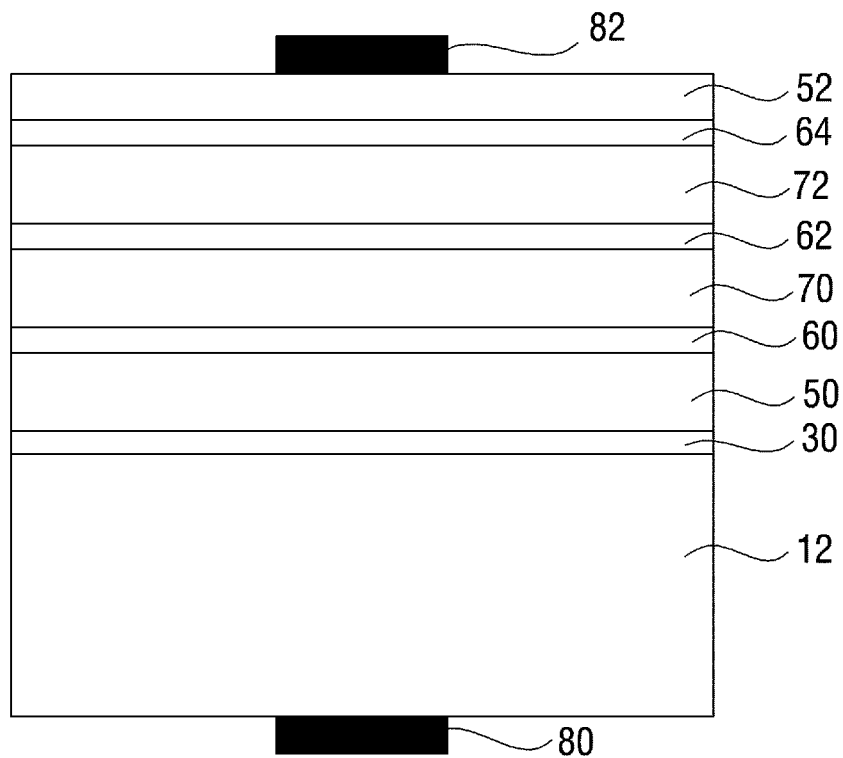
FIG. 7 is a schematic view illustrating a high-voltage driven semiconductor light emitting element according to another embodiment of the present invention.
Figure 8:
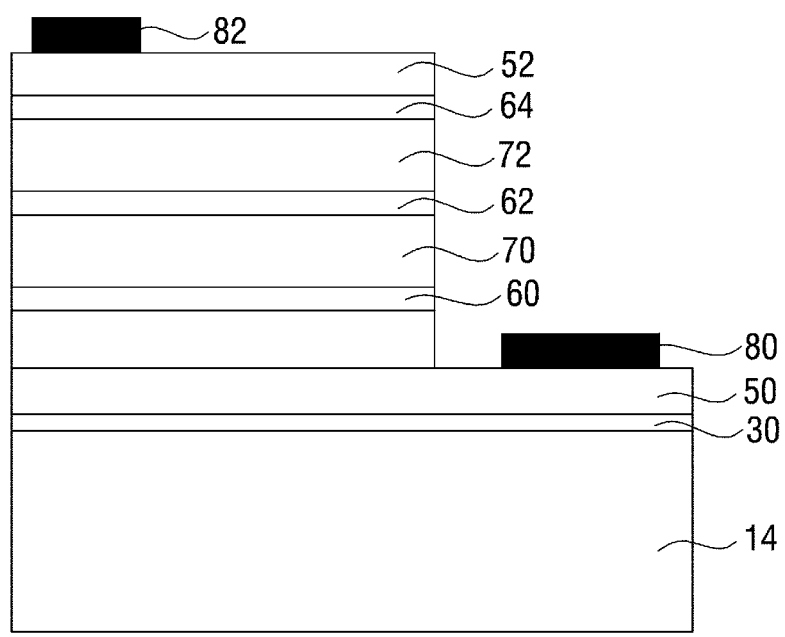
FIG. 8 is a schematic view illustrating a high-voltage driven semiconductor light emitting element according to another embodiment of the present invention.

Further, the high-voltage driven semiconductor light emitting element according to the present invention may be formed on an insulator substrate or may be transferred to the insulator substrate, and such a light emitting element according to the embodiment is illustrated in FIG. 7. As the insulator substrate 10 is employed, a lower electrode is formed not on the substrate but on the lower semiconductor layer 50. When the insulator substrate according to the present embodiment is a growth substrate, the connection layer 30 may correspond to a buffer layer. The insulator substrate 14 according to the present embodiment may be formed of one selected from sapphire, diamond, carbon, quartz and glass.

The high-voltage driven semiconductor light emitting element according to the present invention may be applied to a package, a module and a full-color display in which modules are coupled to each other. In particular, a 3-in-1 package suitable for utilizing a space of the module corresponds to a structure in which a red light chip, a green light chip and a blue light chip are included in one package.

It is noted herein that the high-voltage driven semiconductor light emitting element according to the present invention is limited to a GaAs-based (or AlGaInP-based) element. This is because in growth of a GaN-based semiconductor having an NPNP-type structure or a PNPN-type structure that is continuously vertical, when an n-type GaN-based semiconductor layer is grown after a p-type GaN-based semiconductor layer, the p-type GaN-based semiconductor layer may not exist as a p-type semiconductor layer no longer due to diffusion of a dopant from the previously-grown p-type GaN-based semiconductor layer and has high resistance, and thus the element cannot be implemented. For this reason, in the GaN-based semiconductor element, a plurality of individual active areas cannot be vertically formed. Instead, an independent structure is formed on a side surface (horizontal direction) and is additionally electrically coupled, so that high-voltage driving (manufactured by Seoul Semiconductor, a product name: Acriche) may be possible.

A 3-in-1 package employing the high-voltage driven semiconductor red light emitting element according to the present invention and the conventional 3-in-1 package are modularized, electrical characteristics and efficiency thereof are compared with each other, and a result of comparison is summarized in Table 1.

In consideration of characteristics and efficiency of an applied voltage, the 3-in-1 packaging module employing the high-voltage driven semiconductor red light emitting element according to the present invention is formed by packaging one red chip (including three individual active areas) and two green chips and two blue chips, and is driven using a 7V supply SMPS (manufactured by Meanwell, a model name: SP-320-7.5). The conventional comparative 3-in-1 packaging module is formed by packaging one red chip, one green chip, and one blue chip and is driven using a 5V supply SMPS (manufactured by Meanwell, a model name: SP-320-5) in consideration of a voltage drop in an actual module.

It should be identified that in the application example, the green chip and the blue chip are connected in series to each other on the package by wire bonding, and three independent active areas are included in a vertical single chip which is the red chip.

As the high-voltage driven red light emitting chip according to the present invention is used in the 3-in-1 package, a packaging process may be simplified by replacing various red chips with one red chip, and a larger packaging space may be provided to the green chip and the blue chip, so that packaging work efficiency may be improved.

In addition, as represented in Table 1, power consumption (based on DC) is reduced by 37% as compared with the conventional 3-in-1 package, and accordingly, light emitting efficiency may be improved, an amount of generated heat is reduced, and performance and reliability of a module and a display device employing the same are remarkably improved.

TABLE 1

| Pixel configuration | | Conventional LED module | | LED module according to the present invention | | Power consumption as compared with conventional module | Reduction ratio of power consumption |
|---|---|---|---|---|---|---|---|
| LED electric characteristics | R | 2 V | 20 mA | 6 V | 7 mA | | |
| | G | 3 V | 20 mA | 6 V | 10 mA | | |
| | B | 3 V | 20 mA | 6 V | 10 mA | | |
| Voltage supplied by module | | 5 V | 60 mA | 7 V | 27 mA | | |
| Power consumption (based on DC) | | 0.30 W | | 0.19 W | | 63% | 37% |
| AC-DC conversion efficiency (provided by manufacturer) | | 79% | | | | 83% | |
| Power consumption (based on AC) | | 0.38 W | | 0.23 W | | 60% | 40% |

Further, in a module and a display device including the package including the high-voltage driven semiconductor light emitting element according to the present invention, a high voltage may be applied to the module and the display device, and when a wire configured to supply electric power from the SMPS to each module is selected, a relatively long and thin wire may be selected in consideration of a voltage drop as compared with the conventional short and thick wire, so that a degree of freedom of a design may be increased.

Further, even when a PCB for driving the module is designed, a low current depending on a high voltage is possible, and thus, a wire pattern within the PCB may be designed to be thin. Thus, integration of the wire pattern within the PCB is improved, so that an amount of used PCBs is reduced and the PCB may be miniaturized.

(Embodiment 1)

A high-voltage driven semiconductor red light emitting element according to the present invention includes:

a conductive substrate 10;

a lower semiconductor layer 50 formed on the conductive substrate 10;

a first active area 60 formed on the lower semiconductor layer 50;

a first anti-tunneling layer 70 formed on the first active area 60;

a second active area 62 formed on the first anti-tunneling layer 70;

a second anti-tunneling layer 72 formed on the second active area 62;

a third active area 64 formed on the second anti-tunneling layer 72;

an upper semiconductor layer 52 formed on the third active area 64; and a lower electrode 80 and an upper electrode 82 formed on the conductive substrate 10 and the upper semiconductor layer 52, respectively, wherein the first, second, and third active areas 60, 62, and 64 are formed of an AlGaInP-based material, and are preferably formed of $(Al_xGa_{1-x})_{0.5}In_{0.5}P$ having an Al composition of x in a range of $0 \leq x \leq 0.45$, wherein the first and second anti-tunneling layers 70 and 72, which are semiconductor layers in which electrons or holes are not moved under an applied voltage that is sufficient for activating only one of all of the active areas, independently separate two adjacent active areas from each other in a quantum domain, wherein the first and second anti-tunneling layers 70 and 72 are formed of an AlGaInP-based material, and are preferably formed of $(Al_xGa_{1-x})_{0.5}In_{0.5}P$ having an Al composition of x in a range of $0 \leq x \leq 1$, wherein the first and second anti-tunneling layers 70 and 72 have thicknesses of 3μm or more, and wherein the second anti-tunneling layer 72 and the first anti-tunneling layer 70 are doped with a second type dopant and a first type dopant, respectively, when the upper semiconductor layer 52 is doped with the first type dopant, and are doped with the first type dopant and the second type dopant, respectively, when the upper semiconductor layer 52 is doped with the second type dopant, so that a serial junction of a PNPN or an NPNP from a vertically upper side of the element is formed, and accordingly, a plurality of independent active areas are included in a single semiconductor element.

Further, all of the first, second, and third active areas 60, 62, and 64 are formed of a material having the same composition, and thus have substantially the same wavelength in an area of red light or infrared light.

(Embodiment 2)

A high-voltage driven semiconductor red light emitting element according to another embodiment of the present invention includes:

a conductive substrate 10;

a lower semiconductor layer 50 formed on the conductive substrate 10;

n active areas formed on the lower semiconductor layer 50 and n-1 anti-tunneling layers sandwiched between the active areas (here, n is a natural number of 2 or higher);

an upper semiconductor layer 52 formed on the last $n^{th}$ active area;

a lower electrode 80 and an upper electrode 82 formed on the conductive substrate 10 and the upper semiconductor layer 52, respectively, wherein the n active areas are formed of an AlGaInP-based material, and are preferably formed of $(Al_xGa_{1-x})_{0.5}In_{0.5}P$ having an Al composition of x in a range of $0 \leq x \leq 0.45$, wherein the n-1 anti-tunneling layers are formed of an AlGaInP-based material, and are preferably formed of $(Al_xGa_{1-x})_{0.5}In_{0.5}P$ having an Al composition of x in a range of $0 \leq x \leq 1$, wherein the n-1 anti-tunneling layers, which are semiconductor layers in which electrons or holes are not moved under an applied voltage that is sufficient for activating one active area of all of the active areas, independently separate two adjacent active areas from each other in a quantum domain, wherein the n-1 anti-tunneling layers have thicknesses of 3μm or more, and wherein the even numbered anti-tunneling layers and the odd numbered anti-tunneling layers from the lower side of the n-1 anti-tunneling layers are doped with a second type dopant and a first type dopant, respectively, when the upper semiconductor layer 52 is doped with the first type dopant, and are doped with the first type dopant and the second type dopant, respectively, when the upper semiconductor layer 52 is doped with the second type dopant, so that a serial junction of a PN . . . PN or an NP . . . NP from a vertically upper side of the element is formed, and accordingly, a plurality of independent active areas are included in a single semiconductor element.

Further, all of the n active areas are formed of a material having the same composition, and thus have substantially the same wavelength in an area of red light or infrared light.

(Embodiment 3)

A package including the high-voltage driven semiconductor light emitting element according to embodiment 1 or embodiment 2 and a full-color display device including the same, wherein the package may be a lamp type or a 3-in-1 type, wherein the full-color display device includes:

a module including the package; and a wire, a PCB, an SMPS and a control device configured to apply electric power and a control signal to the module.

(Embodiment 4)

A method for manufacturing a high-voltage driven light emitting element, the method including:

preparing a growth substrate;

forming a lower semiconductor layer on the growth substrate;

forming a first active area on the lower semiconductor layer;

forming a first anti-tunneling layer on the first active area;

forming a second active area on the first anti-tunneling layer;

forming an upper semiconductor layer on the second active area;

forming a second anti-tunneling layer on the second active area;

forming a third active area on the second anti-tunneling layer; and forming an upper semiconductor layer on the third active area, wherein the first anti-tunneling layer and the second anti-tunneling layer, which are semiconductor layers in which electrons or holes are not moved under an applied voltage that is sufficient for activating one active area of the first active area, the second active area, and the third active area, independently separate two adjacent active areas from each other in a quantum domain.

Further, a process of bonding the epilayer of the high-voltage driven light emitting element manufactured by the method to the transfer substrate, and removing the growth substrate may be further added.

Although the embodiments of the present invention have been described above in detail, the embodiments are merely illustrative, but do not limit the present invention. Further, it will be understood by those skilled in the art that the present invention can be variously corrected and modified without departing from the spirit and scope of the present invention.

For example, a not-mentioned third semiconductor layer may be further formed between semiconductor layers constituting the high-voltage driven light emitting element proposed by the present invention. Further, it should be interpreted that differences related to such modifications and applications are included in the scope of the present invention claimed in the claims.

The invention claimed is:
1. A high-voltage driven light emitting element, comprising:
   a substrate;
   a lower semiconductor layer formed on the substrate;
   a first active area formed on the lower semiconductor layer;
   a first anti-tunneling layer formed on the first active area;
   a second active area formed on the first anti-tunneling layer;
   a second anti-tunneling layer formed on the second active area;
   a third active area formed on the second anti-tunneling layer; and
   an upper semiconductor layer formed on the third active area,
   wherein the first anti-tunneling layer and the second anti-tunneling layer, which are semiconductor layers in which electrons or holes are not moved under an applied voltage that is sufficient for activating only one of all of the active areas, independently separate two adjacent active areas from each other in a quantum domain, and
   wherein the first anti-tunneling layer and the second anti-tunneling layer have thicknesses of 3 μm or more, respectively.

2. The high-voltage driven light emitting element of claim 1, wherein the first active area, the second active area, and the third active area are formed of an AlGaInP-based material having the same composition, and emit light having the same wavelength in a red light area or an infrared light area.

3. The high-voltage driven light emitting element of claim 1, wherein the first active area, the second active area, and the third active area are formed of $(Al_xGa_{1-x})_{0.5}In_{0.5}P$ having an Al composition of x in a range of $0 \leq x \leq 0.45$.

4. The high-voltage driven light emitting element of claim 1, wherein the first anti-tunneling layer and the second anti-tunneling layer are formed of $(Al_xGa_{1-x})_{0.5}In_{0.5}P$ having an Al composition of x in a range of $0 \leq x \leq 1$.

5. A high-voltage driven package comprising the high-voltage driven light emitting element of claim 1.

6. The high-voltage driven package of claim 5, wherein the package further comprises a blue light emitting element and a green light emitting element, so that the package has a 3-in-1 form.

7. A high-voltage driven module comprising the high-voltage driven package of claim 6.

8. A full-color display device comprising: the high-voltage driven module claimed in claim 7; and a wire, a PCB, a SMPS and a control device configured to apply electric power and a control signal to the module.

9. A high-voltage driven light emitting element, comprising:
   a substrate;
   a lower semiconductor layer formed on the substrate;
   a first active area formed on the lower semiconductor layer;
   a first anti-tunneling layer formed on the first active area;
   a second active area formed on the first anti-tunneling layer;
   a second anti-tunneling layer formed on the second active area;
   a third active area formed on the second anti-tunneling layer; and
   an upper semiconductor layer formed on the third active area,
   wherein the first anti-tunneling layer and the second anti-tunneling layer, which are semiconductor layers in which electrons or holes are not moved under an applied voltage that is sufficient for activating only one of all of the active areas, independently separate two adjacent active areas from each other in a quantum domain, and
   wherein the first anti-tunneling layer and the second anti-tunneling layer are doped with a first dopant and a second dopant, respectively, when the upper semiconductor layer is doped with the first dopant, and are doped with the second dopant and the first dopant, respectively, when the upper semiconductor layer is doped with the second dopant, so that a serial junction of a PNPN or a NPNP from a vertically upper side of the element is formed.

10. A high-voltage driven light emitting element, comprising:
    a substrate;
    a lower semiconductor layer formed on the substrate;
    n active areas formed on the lower semiconductor layer and n-1 anti-tunneling layers sandwiched between the n active areas respectively, wherein n is a natural number of 2 or higher; and
    an upper semiconductor layer formed on the $n^{th}$ active area,
    wherein the first anti-tunneling layer and the second anti-tunneling layer, which are semiconductor layers in which electrons or holes are not moved under an applied voltage that is sufficient for activating only one of all of the active areas, independently separate two adjacent active areas from each other in a quantum domain, and
    wherein each of the n-1 anti-tunneling layers has a thicknesses of 3 μm or more.

11. The high-voltage driven light emitting element of claim 10, wherein the n active areas are formed of an AlGaInP-based material having the same composition, and emit light having the same wavelength in a red light area or an infrared light area.

12. The high-voltage driven light emitting element of claim 10, wherein the n active areas are formed of $(Al_xGa_{1-x})_{0.5}In_{0.5}P$ having an Al composition of x in a range of $0 \leq x \leq 0.45$.

13. The high-voltage driven light emitting element of claim 10, the n-1 anti-tunneling layers are formed of $(Al_xGa_{1-x})_{0.5}In_{0.5}P$ having an Al composition of x in a range of $0 \leq x \leq 1$.

14. The high-voltage driven light emitting element of claim 10,
    A high-voltage driven light emitting element, comprising:
    a substrate;
    a lower semiconductor layer formed on the substrate;
    n active areas formed on the lower semiconductor layer and n-1 anti-tunneling layers sandwiched between the n active areas respectively, wherein n is a natural number of 2 or higher; and
    an upper semiconductor layer formed on the $n^{th}$ active area,
    wherein the first anti-tunneling layer and the second anti-tunneling layer, which are semiconductor layers in which electrons or holes are not moved under an applied voltage that is sufficient for activating only one of all of the active areas, independently separate two adjacent active areas from each other in a quantum domain, and wherein the odd numbered anti-tunneling layers and the even numbered anti-tunneling layers are doped with a first dopant and a second dopant, respectively, when the upper semiconductor layer is doped with the first dopant, and are doped with the second dopant and the first dopant, respectively, when the upper semiconductor layer is doped with the second dopant, so that a serial junction of a PN . . . PN or a NP . . . NP from a vertically upper side of the element is formed.

15. A method for manufacturing a high-voltage driven light emitting element, the method comprising:
preparing a growth substrate;
forming a lower semiconductor layer on the growth substrate;
forming a first active area on the lower semiconductor layer;
forming a first anti-tunneling layer on the first active area;
forming a second active area on the first anti-tunneling layer;
forming an upper semiconductor layer on the second active area;
forming a second anti-tunneling layer on the second active area;
forming a third active area on the second anti-tunneling layer; and
forming an upper semiconductor layer on the third active area,
wherein the first anti-tunneling layer and the second anti-tunneling layer, which are semiconductor layers in which electrons or holes are not moved under an applied voltage that is sufficient for activating only one of the first active area, the second active area, and the third active area, independently separate two adjacent active areas from each other in a quantum domain, and
wherein the first anti-tunneling layer and the second anti-tunneling layer have thicknesses of 3 µm or more, respectively.

16. The method of claim 15, wherein the first active area, the second active area, and the third active area are formed of an AlGaInP-based material having the same composition, and emit light having the same wavelength in a red light area or an infrared light area.

17. The method of claim 15, wherein the first active area, the second active area, and the third active area are formed of $(Al_xGa_{1-x})_{0.5}In_{0.5}P$ having an Al composition of x in a range of $0 \le x \le 0.45$.

18. The method of claim 15, wherein the first anti-tunneling layer and the second anti-tunneling layer are formed of $(Al_xGa_{1-x})_{0.5}In_{0.5}P$ having an Al composition of x in a range of $0 \le x \le 1$.

19. A method for manufacturing a high-voltage driven light emitting element, the method comprising:
preparing a growth substrate;
forming a lower semiconductor layer on the growth substrate;
forming a first active area on the lower semiconductor layer;
forming a first anti-tunneling layer on the first active area;
forming a second active area on the first anti-tunneling layer;
forming an upper semiconductor layer on the second active area;
forming a second anti-tunneling layer on the second active area;
forming a third active area on the second anti-tunneling layer; and
forming an upper semiconductor layer on the third active area,
wherein the first anti-tunneling layer and the second anti-tunneling layer, which are semiconductor layers in which electrons or holes are not moved under an applied voltage that is sufficient for activating only one of the first active area, the second active area, and the third active area, independently separate two adjacent active areas from each other in a quantum domain, and
wherein the first anti-tunneling layer and the second anti-tunneling layer are doped with a first dopant and a second dopant, respectively, when the upper semiconductor layer is doped with the first dopant, and are doped with the second dopant and the first dopant, respectively, when the upper semiconductor layer is doped with the second dopant, so that a serial junction of a PNPN or a NPNP from a vertically upper side of the element is formed.

* * * * *